United States Patent [19]

Beam, III et al.

[11] Patent Number: 5,416,040
[45] Date of Patent: May 16, 1995

[54] METHOD OF MAKING AN INTEGRATED FIELD EFFECT TRANSISTOR AND RESONANT TUNNELING DIODE

[75] Inventors: Edward A. Beam, III, Dallas; Alan C. Seabaugh, Richardson, both of Tex.

[73] Assignee: Texas Instruments Incorporated, Dallas, Tex.

[21] Appl. No.: 153,116

[22] Filed: Nov. 15, 1993

[51] Int. Cl.$^6$ .................................... H01L 21/70
[52] U.S. Cl. ............................. 437/60; 437/51; 437/904; 437/915; 437/133
[58] Field of Search ............ 437/60, 59, 55, 133, 437/904, 915, 51; 148/DIG. 56, DIG. 65; 257/14, 20, 25, 30, 104, 105

[56] References Cited

U.S. PATENT DOCUMENTS

| | | | |
|---|---|---|---|
| 4,242,595 | 12/1980 | Lehovec | 257/105 |
| 4,641,173 | 2/1987 | Malhi et al. | 257/30 |
| 5,229,623 | 7/1993 | Tanoue et al. | 257/21 |
| 5,289,015 | 2/1994 | Chirovsky et al. | 257/21 |

FOREIGN PATENT DOCUMENTS

| | | | |
|---|---|---|---|
| 3093160 | 4/1988 | Japan | 257/25 |
| 3129665 | 6/1988 | Japan | 257/25 |
| 4035965 | 2/1989 | Japan | 257/25 |
| 2125472 | 5/1990 | Japan | 257/25 |

*Primary Examiner*—Brian E. Hearn
*Assistant Examiner*—Tuan Nguyen
*Attorney, Agent, or Firm*—Dana L. Burton; Richard A. Stoltz; James C. Kesterson

[57] ABSTRACT

This is an integrated device which comprises an integrated transistor and resonant tunneling diode where the transistor comprises a substance 10, a buffer layer layer 12 over the substrate 10, and a channel layer 14 over the buffer 12; and the resonant tunneling diode (RTD) comprises a first contact layer 18, a first tunnel barrier layer 20 over the first contact layer 18, a quantum well 22 over the first tunnel barrier layer 20, a second tunnel barrier layer 24 over the quantum well 22, and a second contact layer 26 over the second tunnel barrier layer 24. Other devices and methods are also disclosed.

10 Claims, 5 Drawing Sheets

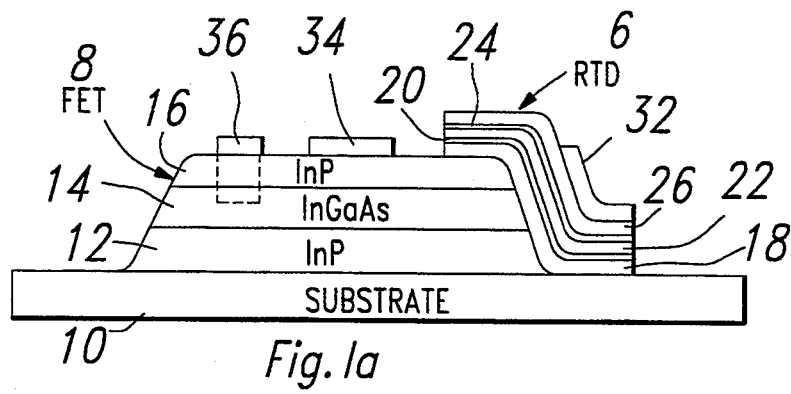
Fig. 1a
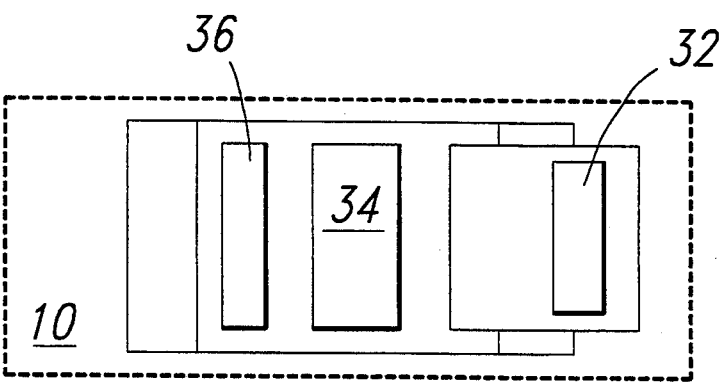
Fig. 1b
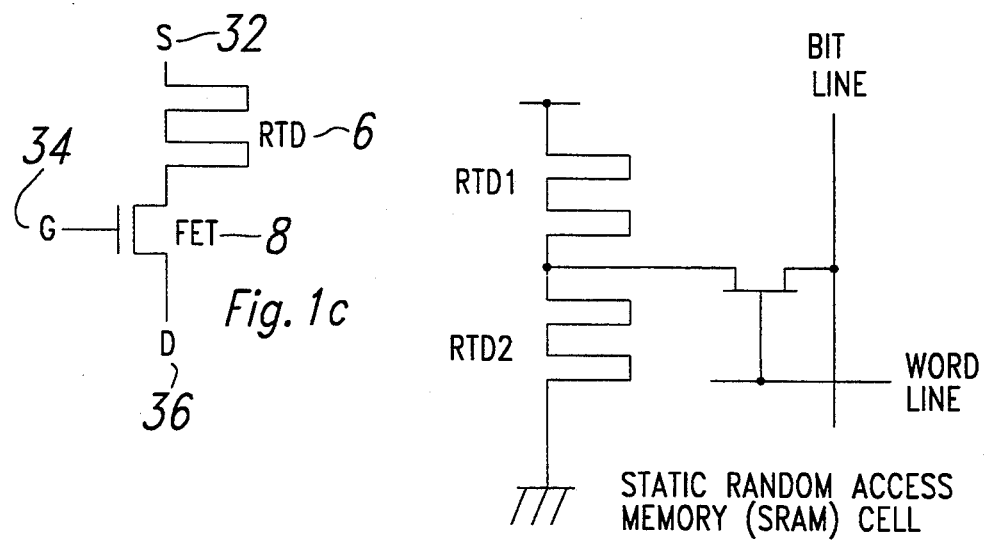
Fig. 1c
STATIC RANDOM ACCESS
MEMORY (SRAM) CELL
Fig. 4

METHOD OF MAKING AN INTEGRATED FIELD EFFECT TRANSISTOR AND RESONANT TUNNELING DIODE

FIELD OF THE INVENTION

This invention generally relates to electronic devices and more particularly to resonant tunneling devices and systems.

BACKGROUND OF THE INVENTION

Without limiting the scope of the invention, its background is described in connection with resonant tunneling devices.

Integrated circuits have become the technology of choice for performing logic functions. The downscaling of minimum device geometries has provided for increases in the functional density and performance of integrated circuits. In electronic devices having nanometer dimensions, the wave behavior of electrons, namely interference and resonance, can be utilized to obtain useful electronic behavior for switching and logic.

A resonant tunneling diode (RTD) in its simplest embodiment consists of a sequence of five semiconductor layers. The outer two layers are the contact layers into which electrons enter and exit the semiconductor layer sequence. The interior three dissimilar semiconductor layers differ in their energy band gaps in the sequence wide/narrow/wide band gap with layer thicknesses comparable to the electron Bloch wavelength (typically less than 10 nm). This sequence of layers produces an energy profile through which electrons must travel and which consists of two energy barriers separated by a narrow region referred to as a quantum well.

Classically, an electron with energy, called the Fermi energy, approaching the first energy barrier with an energy below the barrier energy is reflected, analogous to a baseball rebounding off a concrete wall or to an electromagnetic wave at the end of an open-circuited transmission line. Quantum mechanics, however, allows that as the physical dimensions of the barrier decrease toward the wavelength of the particle, there is an increasing probability that the particle will be transmitted instead of reflected. Thus under certain conditions an electron can pass through the barrier even with energy below the barrier potential. This classically-forbidden phenomenon is called tunneling.

If the quantum well width is selected to be approximately equal to some integer or half-integer multiple of the electron wavelength, a standing wave can be built up by constructive interference analogous to the standing waves in a microwave cavity. Electrons at these wavelengths couple into and out of the quantum well more readily than others.

The electron energy, E, and its wavelength, I, are inversely related by the equation, $E = h^2/2\ ml^2$, where h is Planck's constant and m is the effective electron mass. Since the electron's energy can be controlled by adjusting the bias across the structure, the transmission (or current flow) through the double-barrier depends sensitively on the applied voltage. One can think of the double-barrier structure as an energy bandpass filter which transmits for certain applied biases and reflects the electron for other applied biases. The electron is said to be in resonance when the incoming electron energy matches the resonant transmission energy of the quantum-well structure.

In the RTD, the current increases monotonically with applied voltage until the average incoming electron energy is approximately equal to the resonance energy and the electron tunnels efficiently through the double-barrier structure. At slightly higher energy (applied bias) the electron no longer couples into the well efficiently and the transmission (current) is reduced. At still higher applied voltages, the electron's energy is sufficient for it to get over the barriers giving rise to an increasing current with bias. Thus the current-voltage characteristic of the resonant tunneling diode is N-shaped. It is this characteristic which is utilized to advantage in resonant tunneling electron devices.

SUMMARY OF THE INVENTION

Integration of multiple device types on a substrate is generally accomplished by epitaxial growth and processing of laterally separated devices with subsequent interconnection, or by the growth of a stack of device structure layers and then processing and interconnection. These approaches often require large surface areas and/or result in non-planar surfaces. The present invention provides a method for increasing the integration density of multiple devices by the growth of a RTD on the mesa sidewall of a grown device structure. This results in an intrinsic interconnection between the RTD and an internal transistor conduction layer and a reduced surface area requirement compared to laterally separated devices.

Generally, and in one form of the invention an integrated device is presented which comprises an integrated transistor and resonant tunneling diode where the transistor comprises a substrate, a buffer layer over the substrate, and a channel layer over the buffer layer; and the resonant tunneling diode (RTD) comprises a first contact layer, a first tunnel barrier layer over the first contact layer, a quantum well over the first tunnel barrier layer; a second tunnel barrier layer over the quantum well, and a second contact layer over the second tunnel barrier layer. Preferably, the transistor is a Field Effect Transistor (FET) with a mesa defined structure. The RTD is preferably placed on the sidewall of the mesa defined structure. The device may further comprise an insulating layer over the channel layer and may be of III–V materials. The device may comprise multiple RTDs.

In another form of the invention a method of making an integrated device which comprises an integrated transistor and RTD is presented where the transistor formation comprises the steps of forming a substrate, forming a buffer layer over the substrate and forming a channel layer over the buffer layer; and the RTD formation comprises the steps of forming a first contact layer on the mesa sidewall, forming a first tunnel barrier layer over the first contact layer, forming a quantum well layer over the first tunnel barrier layer, forming a second tunnel barrier layer over the quantum well layer and forming a second contact layer over the second tunnel barrier layer.

The transistor is preferably a mesa defined structure and the device may be formed by various processes. For example, it may be formed by a process comprising the steps of blanket growth of the transistor, mesa patterning of the transistor, blanket growth of the RTD over the transistor, masking portions of the RTD and etching unmasked portions of the RTD. Another possible process comprises the steps of selectively growing the transistor, masking the transistor where the RTD is not to be formed and selectively growing the RTD over the transistor in the defined openings. The device may be formed with multiple RTDs and may or may not be stacked depending on the desired application.

BRIEF DESCRIPTION OF THE DRAWINGS

In the drawings:

FIG. 1a-1c are a cross-sectional view, a top view, and a schematic, respectively, of an integrated field effect transistor and resonant tunneling diode;

FIG. 4 is a schematic of an SRAM cell;

Corresponding numerals and symbols in the different figures refer to corresponding parts unless otherwise indicated.

DETAILED DESCRIPTION OF PREFERRED EMBODIMENTS

It has been recently shown that the combination of resonant tunneling diodes (RTDs) and field-effect transistors (FET) can be used to create SRAMs, analog-to-digital converters, adders and multipliers. The initial approach to demonstrating these functions is to form discrete RTDs and HFETs and interconnect by conventional means. This will provide greater functionality and a reduction in transistors over conventional circuit approaches. To fully exploit this circuit technology and other potential uses of FET/RTD combinations requires a compact FET/RTD.

The present invention provides integration of a field effect transistor (FET) structure with a resonant tunneling diode (RTD). An embodiment of the device structure consists of a mesa defined FET with a regrown RTD structure on the mesa sidewall as shown in FIG. 1. Several methods could be used to produce this type of structure, two of which are shown schematically in FIGS. 2a-d and 3a-d. Various combinations of these two methods could also be used. FIGS. 2a-d (Method 1) shows a blanket growth, mesa patterning, blanket regrowth, etching process flow. FIGS. 3a-d(Method 2) shows a selective growth, masking, selective growth process flow. Both of these methods may be used to produce the same resultant structure.

Figure 2A:
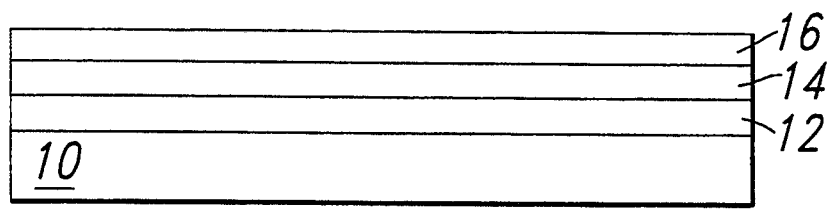
FIG. 2a-2d are cross-sectional views, at different processing stages, of a first method for forming an integrated field effect transistor and resonant tunneling diode.
Figure 2B:
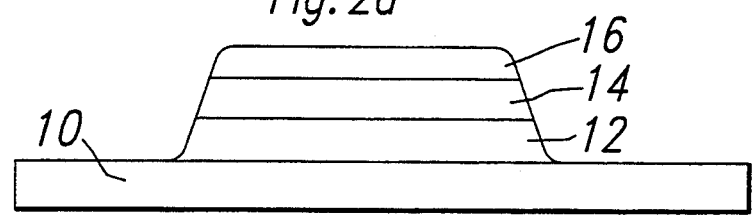
Figure 2C:
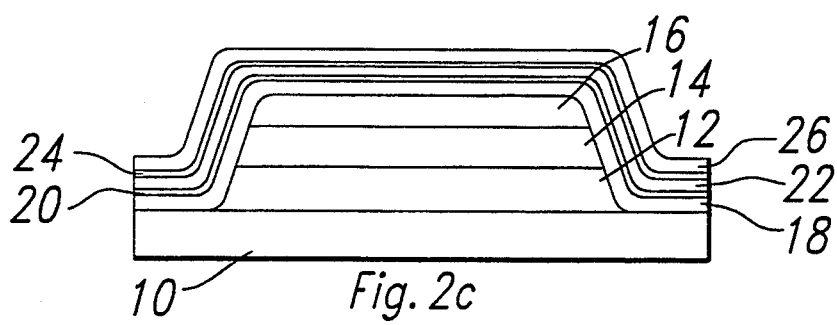
Figure 3A:
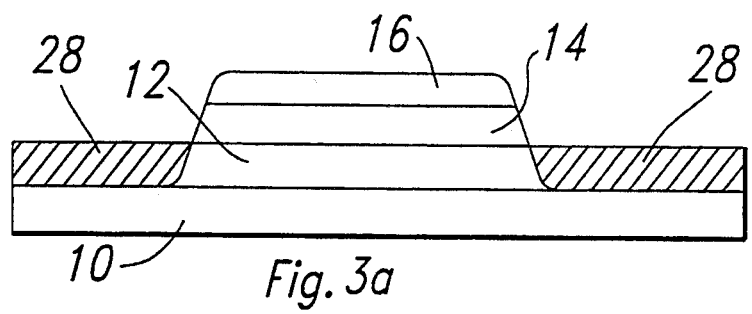
FIG. 3a-3d are cross-sectional views, at different processing stages, of a second method for forming an integrated field effect transistor and resonant tunneling diode.
Figure 3B:
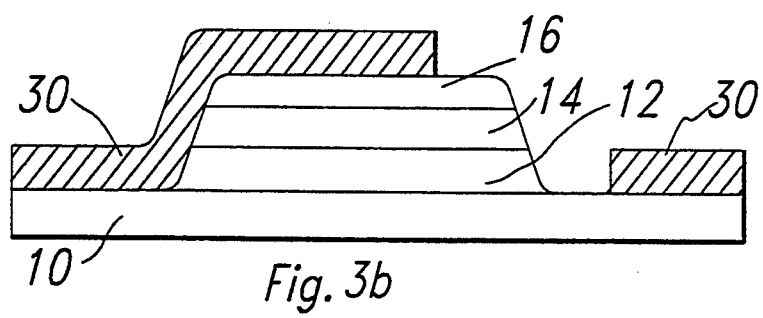

Several embodiments of the present invention are described below, Table 1 and Table 2 may be referred to for example materials and layer thicknesses. The information provided in Tables 1 and 2 provide only example embodiments and are not intended to be limiting on the present invention. Shown in FIGS. 1a-1c is the integrated lateral RTD 6 and FET 8 device structure after metallization in both cross section (FIG. 1a) and top views (FIG. 1b) along with the circuit schematic diagram FIG. 1c). A buffer layer 12 is formed on a substrate 10. A channel layer 14 is formed on the buffer layer 12. An insulating layer 16 may be formed over the channel layer 14. If Method 1 is used these layers are formed (FIG.2a) followed by mesa patterning (FIG. 2b). If Method 2 is used the substrate 10 is masked 28, with silicon dioxide, for example, prior to epitaxial growth. Layer growth with this oxide mask results in selective growth as shown in FIG. 3a.

Figure 2D:
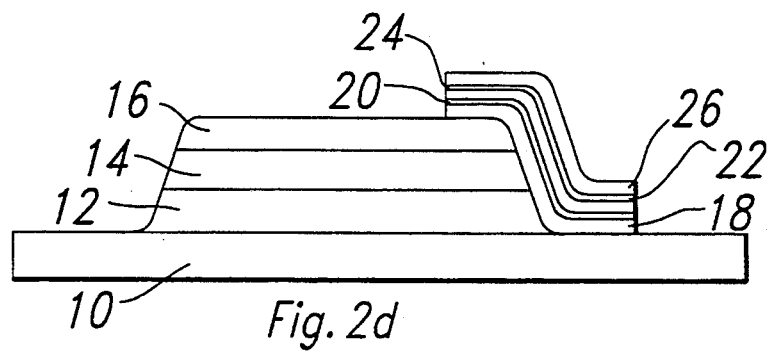
Figure 3C:
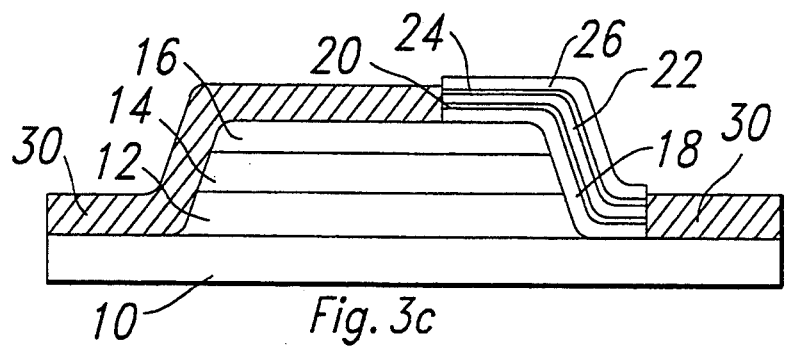
Figure 3D:
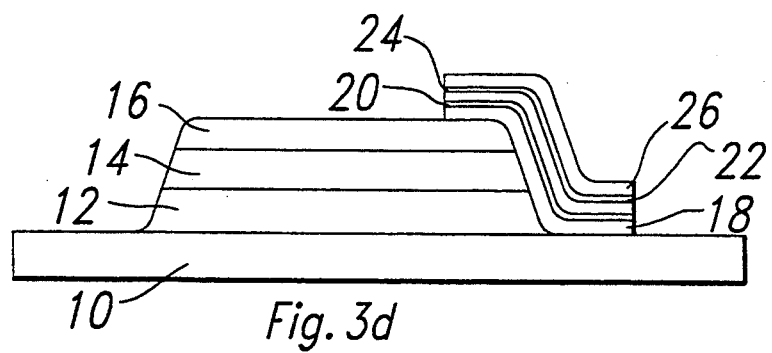

The layers of the RTD are preferably formed on the sidewall of the mesa structure that has been formed. A first contact layer 18 is formed on the sidewall of the mesa structure. A first tunnel barrier layer 20 is formed over the first contact layer 18. The quantum well 22 is formed over the first tunnel barrier layer 18 followed by a second tunnel barrier layer 24 formed over the quantum well 22. A second contact layer 26 is formed over the second barrier layer 24. If the example provided in Table 1 is used the first and second contact layers 18,26 are preferably n- type with Si doping of $2\times 10^{18}$ cm$^{-3}$. The first tunnel barrier layer 20, second tunnel barrier layer 24, and quantum well 22 are preferably undoped in the example provided in Table 1. If Method 1 is used the RTD layers are grown (FIG. 2c) followed by etching to form the RTD on the sidewall of the FET (FIG. 2d). If Method 2 is utilized the mesa structure is masked 30 in all areas except where the RTD formation is desired followed by formation of the RTD layers in the unmasked area (FIG. 3c). The masking material 30, which may be oxide or any other appropriate masking material, is then generally removed (FIG. 3d). Metallization may be effected for the source 32, gate 34 and drain 36, as shown in FIGS. 1 a and 1b. The drain contact 36 is alloyed shown by the dotted line to provide an ohmic connection to the channel 14.

Figure 5A:
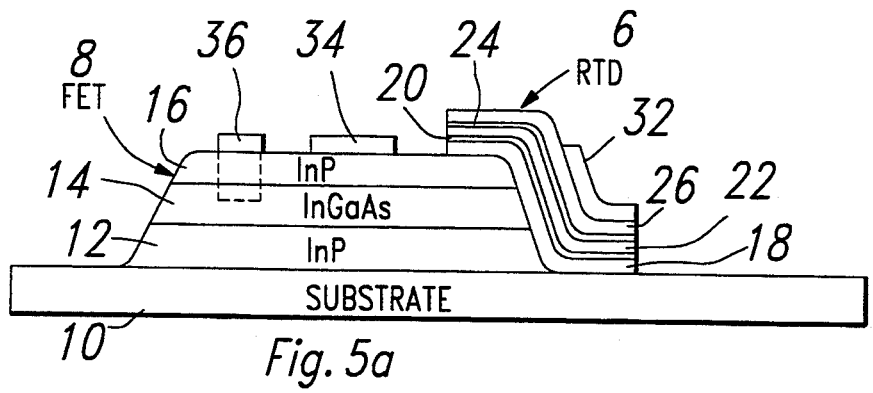
FIG. 5a-5c are a cross-sectional view, a top view, and a schematic, respectively, of an embodiment of an integrated field effect transistor and multiple resonant tunneling diodes.
Figure 5B:
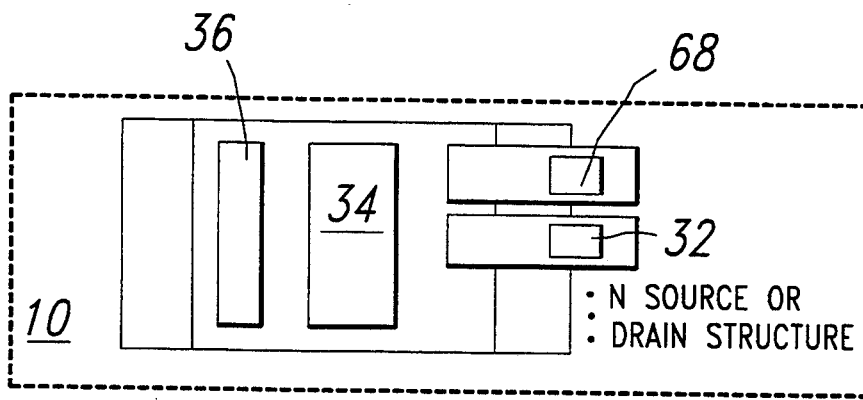
Figure 5C:
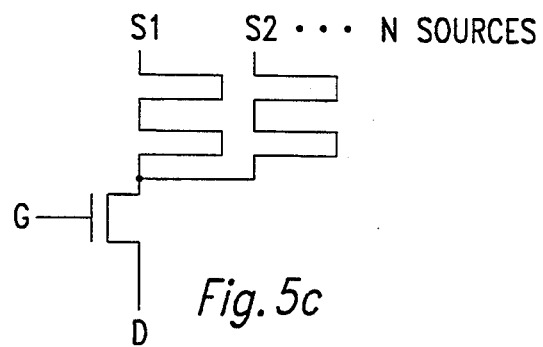

A single field-effect transistor (FET) and two resonant tunneling diodes (RTD) can be used to form a compact SRAM cell (see FIG. 4). The present invention provides a method for improving the integration of multiple devices by the growth of a RTD on the mesa sidewall of a grown device structure. This results in an intrinsic interconnection of RTD to FET channel and a reduced surface area requirement compared to laterally separated devices. By growth of multiple lateral resonant tunneling diodes as shown in FIGS. 5a-5c, additional functionality can be added to the single cell. For example, with the number of sources 32, 68 equal to two the SRAM cell of FIG. 4 is implemented. The methods provided in FIGS. 2a-2d and 3a-3d may be used to form the device of FIGS. 5a- 5c with multiple sources 32, 68. The same technique can be utilized to form multiple drains.

Figure 6A:
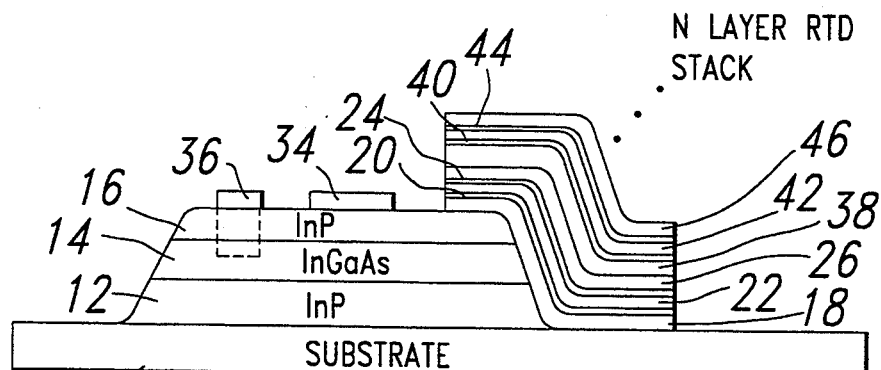
FIG. 6a-6b are a cross-sectional view and a schematic, respectively, of an embodiment of an integrated field effect transistor and multiple resonant tunneling diodes.
Figure 7A:
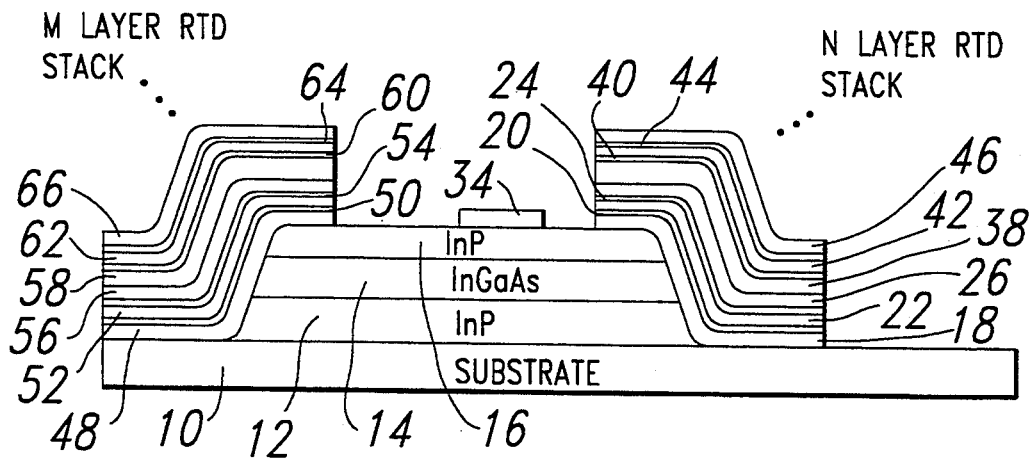
FIG. 7a-7b are a cross-sectional view and a schematic, respectively, of an embodiment of an integrated field effect transistor and multiple resonant tunneling diodes.
Figure 6B:
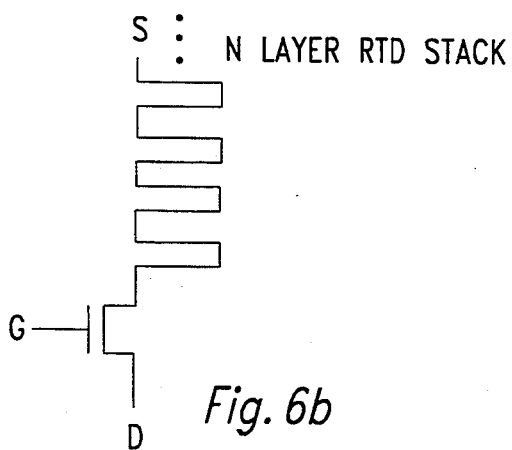
Figure 7B:
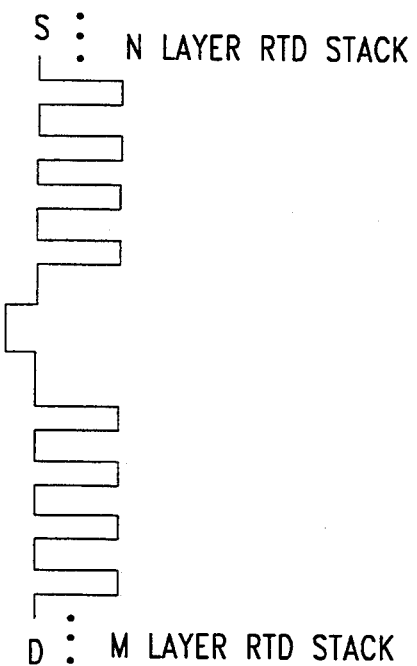

Vertical integration of resonant tunneling diodes as described by Seabaugh, et al. "Nine-State Resonant Tunneling Diode Memory," IEEE Electron Device Letters, pp. 479–481(1993) can be used to form multistate memory circuits. Shown in FIGS. 6a-6b is a cross section and schematic view of a multi-state memory cell in which the FET can form either the load or the pass-gate for the circuit. The possible implementations of the FET/lateral RTD combination can be extended to both the source and drain crystallographic faces and the number of RTDs can be determined by selective removal processing to form a general class of circuit configuration as shown in FIGS. 7a–7b. The methods of FIGS. 2a–2d and 3a–3d may be used to realize the devices shown in FIGS. 6a–6b and FIGS. 7a–7b.

The multiple RTDs shown in FIGS. 5a–5c, 6a–6b and 7a–7b may be formed in the same manner as described for the single RTD shown in FIGS. 1a–1c. The example layer thicknesses and materials may also be the same, as is shown in Table 2.

Several embodiments have been described in detail hereinabove. It is to be understood that the scope of the invention also comprehends embodiments different from those described, yet within the scope of the claims. For example, other materials than those suggested could be utilized. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| Element Number | Layer | Material | Approximate Thickness |
|---|---|---|---|
| 10 | Substrate | InP | — |
| 12 | Buffer | InP | 300 nm |
| 14 | Channel | InGaAs | 50 nm |
| 16 | Insulating | InP | 40 nm |
| 18 | First Contact | InGaAs | 50 nm |
| 20 | First Tunnel Barrier | AlAs | 2 nm |
| 22 | Quantum Well | InGaAs | 5 nm |
| 24 | Second Tunnel Barrier | AlAs | 2 nm |
| 26 | Second Contact | InGaAs | 50 nm |

TABLE 2

| Element Number | Layer | Material | Approximate Thickness |
|---|---|---|---|
| 38 | First Contact | InGaAs | 50 nm |
| 40 | First Tunnel Barrier | AlAs | 2 nm |
| 42 | Quantum Well | InGaAs | 5 nm |
| 44 | Second Tunnel Barrier | AlAs | 2 nm |
| 46 | Second Contact | InGaAs | 50 nm |
| 48 | First Contact | InGaAs | 50 nm |
| 50 | First Tunnel Barrier | AlAs | 2 nm |
| 52 | Quantum Well | InGaAs | 5 nm |
| 54 | Second Tunnel Barrier | AlAs | 2 nm |
| 56 | Second Contact | InGaAs | 50 nm |
| 58 | First Contact | InGaAs | 50 nm |
| 60 | First Tunnel Barrier | AlAs | 2 nm |
| 62 | Quantum Well | InGaAs | 5 nm |
| 64 | Second Tunnel Barrier | AlAs | 2 nm |
| 66 | Second Contact | InGaAs | 50 nm |

What is claimed is:

1. A method of making an integrated device comprising:
   forming a transistor comprising the steps of:
      forming a substrate;
      forming a buffer layer over said substrate; and
      forming a channel layer over said buffer layer;
   forming a resonant tunneling diode (RTD) comprising the steps of:
      forming a first contact layer on a sidewall of said transistor;
      forming a first tunnel barrier layer over said first contact layer;
      forming a quantum well layer over said first tunnel barrier layer;
      forming a second tunnel barrier layer over said quantum well layer; and
      forming a second contact layer over said second tunnel barrier layer;
   wherein said transistor and said RTD are integrated.

2. The method of claim 1, wherein said transistor is a Field Effect Transistor (FET).

3. The method of claim 1, wherein said transistor is a mesa defined structure.

4. The method of claim 1, wherein said device is formed by a process comprising the steps of:
   blanket growth of said transistor;
   mesa patterning of said transistor;
   blanket growth of said RTD over said transistor;
   masking portions of said RTD; and
   etching unmasked portions of said RTD.

5. The method of claim 1, wherein said device is formed by a process comprising the steps of:
   selectively growing said transistor;
   masking said transistor where said RTD is not to be formed; and
   selectively growing said RTD over said transistor where not masked.

6. The method of claim 1, further comprising forming an insulating layer over said channel layer.

7. The method of claim 1, wherein said device is formed of III–V materials.

8. The method of claim 1, wherein multiple RTDs are formed.

9. The method of claim 8, wherein said RTDs are stacked.

10. The method of claim 8, wherein said RTDs are formed on both sidewalls of said transistor.

* * * * *